(12) United States Patent
Wirz et al.

(10) Patent No.: US 11,764,096 B2
(45) Date of Patent: Sep. 19, 2023

(54) METHOD FOR SEMICONDUCTOR DIE EDGE PROTECTION AND SEMICONDUCTOR DIE SEPARATION

(71) Applicant: Micron Technology, Inc., Boise, ID (US)

(72) Inventors: Brandon P. Wirz, Boise, ID (US); Andrew M. Bayless, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 90 days.

(21) Appl. No.: 16/923,754

(22) Filed: Jul. 8, 2020

(65) Prior Publication Data

US 2022/0013401 A1 Jan. 13, 2022

(51) Int. Cl.
*H01L 21/683* (2006.01)
*H01L 21/48* (2006.01)
*H01L 23/48* (2006.01)

(52) U.S. Cl.
CPC ...... *H01L 21/6836* (2013.01); *H01L 21/4814* (2013.01); *H01L 23/481* (2013.01)

(58) Field of Classification Search
CPC ............. H01L 21/6838; H01L 24/17; H01L 21/76816; H01L 21/78; H01L 21/82; H01L 24/11
See application file for complete search history.

(56) References Cited

U.S. PATENT DOCUMENTS

| | | | | |
|---|---|---|---|---|
| 2003/0143818 A1* | 7/2003 | Vasquez | ................. | H01L 21/78 438/460 |
| 2005/0148160 A1* | 7/2005 | Farnworth | .............. | H01L 23/48 257/E29.022 |
| 2007/0087524 A1* | 4/2007 | Montgomery | .......... | H01L 21/78 438/428 |
| 2010/0009518 A1* | 1/2010 | Wu | ......................... | H01L 21/78 257/E21.001 |
| 2015/0221554 A1* | 8/2015 | Kosaka | ............... | H01L 29/2003 438/462 |
| 2018/0166396 A1* | 6/2018 | Lee | ...................... | H01L 23/5386 |
| 2020/0105601 A1* | 4/2020 | Lai | ..................... | H01L 21/76816 |
| 2020/0105690 A1* | 4/2020 | Li | ...................... | H01L 23/53223 |
| 2021/0296194 A1* | 9/2021 | Shah | ....................... | H01L 25/50 |

\* cited by examiner

*Primary Examiner* — Brian Turner
(74) *Attorney, Agent, or Firm* — Perkins Coie LLP

(57) ABSTRACT

Methods for protecting edges of semiconductor dies are disclosed. Further, the disclosed methods provide for separating the semiconductor dies without using a dicing technique. In one embodiment, a plurality of trenches may be formed on a front side of a substrate including a plurality of semiconductor dies. Individual trenches may correspond to scribe lines of the substrate where each trench includes a depth greater than a final thickness of the semiconductor dies. A dielectric layer may be formed on sidewalls of the trenches, thereby protecting the edges of the semiconductor dies, prior to filling the trenches with an adhesive material. Subsequently, the substrate may be thinned from a back side such that the adhesive material in the trenches may be exposed from the back side. The adhesive material may be removed to singulate individual semiconductor dies of the plurality from the substrate.

13 Claims, 8 Drawing Sheets

METHOD FOR SEMICONDUCTOR DIE EDGE PROTECTION AND SEMICONDUCTOR DIE SEPARATION

TECHNICAL FIELD

The present disclosure generally relates to semiconductor die assemblies, and more particularly relates to semiconductor die edge protection and semiconductor die separation.

BACKGROUND

Semiconductor packages typically include one or more semiconductor dies (e.g., memory chip, microprocessor chip, imager chip) mounted on a substrate, encased in a protective covering. The semiconductor dies may include functional features, such as memory cells, processor circuits, or imager devices, as well as bond pads electrically connected to the functional features. The bond pads can be electrically connected to corresponding conductive structures of the substrate, which may be coupled to terminals outside the protective covering such that the semiconductor die can be connected to higher level circuitry.

In some semiconductor packages, two or more semiconductor dies may be stacked on top of each other to reduce footprints of the semiconductor packages (which may be referred to as multi-chip packages). The stacked semiconductor dies may include three-dimensional interconnects (e.g., through-silicon vias (TSVs)) to route electrical signals between the semiconductor dies. The semiconductor dies may be thinned to reduce overall thicknesses of such semiconductor packages, as well as to mitigate issues related to forming the three-dimensional interconnects through the stacked semiconductor dies. Typically, a carrier wafer is attached to a front side of a substrate (e.g., a wafer) having the semiconductor dies fabricated thereon such that the substrate may be thinned from its back side. Further, the substrate may be diced to singulate individual semiconductor dies while attached to an adhesive layer of a sheet of mount tape. The dicing step, however, tends to generate particles that causes yield loss. Further, the dicing step utilizing a blade may be incompatible with new advanced materials included in the semiconductor dies.

BRIEF DESCRIPTION OF THE DRAWINGS

Many aspects of the present technology can be better understood with reference to the following drawings. The components in the drawings are not necessarily to scale. Instead, emphasis is placed on illustrating clearly the principles of the present technology and overall features.

DETAILED DESCRIPTION

Figure 1A:
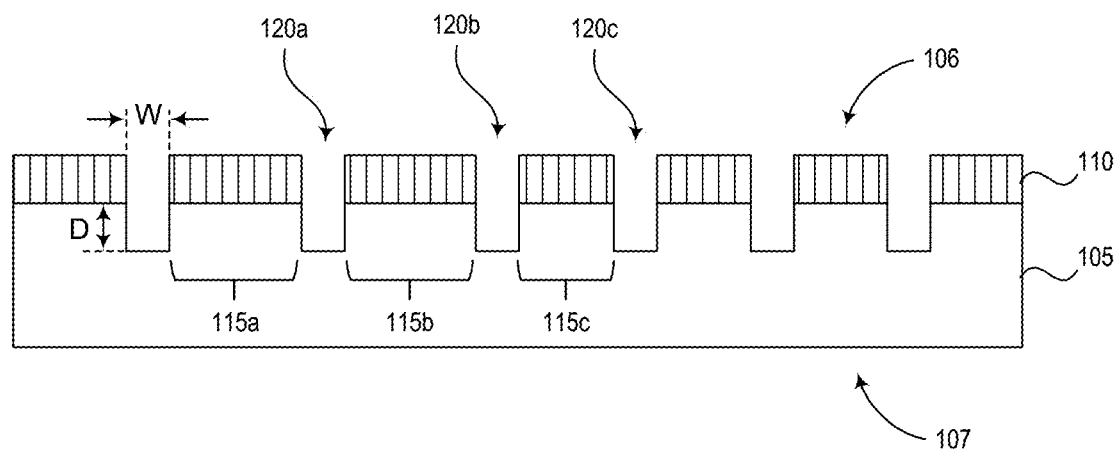
FIGS. 1A through 1L illustrate an example process of protecting semiconductor die edge and separating semiconductor dies in accordance with an embodiment of the present technology.

Specific details of several embodiments for protecting edges (and/or back sides) of semiconductor dies and separating the semiconductor dies for semiconductor device assemblies, and associated methods are described below.

The scheme of protecting edges of semiconductor dies as described herein may not only provide for a passivation layer around edges (and a back side) of a semiconductor die but also provide an alternative die separation technique suitable for integrating new materials and/or deploying advanced packaging technology compared to conventional dicing techniques. For example, the passivation layer around the edges of semiconductor dies may reduce cracks (or chipping) at the edges or propagation of such cracks inward toward integrated circuits and/or various components of the semiconductor dies. Additionally, the passivation layer may include a diffusion barrier (e.g., a nitride layer) to block contaminants (e.g., metallic atoms such as copper) from diffusing through silicon substrate of the semiconductor die, which may cause certain reliability issues.

Moreover, the die separation technique in accordance with the present technology may eliminate conventional dicing steps (e.g., blade dicing, laser dicing) that generate particles that attach to the surface of the dies, causing yield loss. The conventional dicing steps also presents challenges for integrating new materials (e.g., low-k and/or extreme low-k materials) that may be used to build state-of-the-art semiconductor devices. In some cases, the conventional dicing steps may leave contaminants on the surface of the semiconductor dies, which, in return, may hinder deploying advanced packaging techniques—e.g., a combination bonding technique that forms direct bonding of two semiconductor dies, face-to-face.

As such, the scheme of protecting edges of semiconductor dies and separating semiconductor dies in accordance with the present technology provides various benefits, such as decreasing particle counts to improve yield, protecting the semiconductor dies to improve reliability, reducing contaminants for deploying advanced packaging techniques, facilitating integration of new materials that may be incompatible with conventional dicing technique, among others. Further, the present technology may reduce width of dicing lanes such that more semiconductor dies may be generated per wafer—e.g., reducing a production cost. As described in more detail below, the present technology may facilitate relieving wafer-level mechanical stress during the wafer back side processing steps (e.g., reduced wafer warpage) due to an adhesive material placed between semiconductor dies, which may absorb stresses exerted on the wafer.

The term "semiconductor device or die" generally refers to a solid-state device that includes one or more semiconductor materials. Examples of semiconductor devices include logic devices, memory devices, microprocessors, or diodes, among others. Such semiconductor devices may include integrated circuits or components, data storage elements, processing components, and/or other features manufactured on semiconductor substrates. Further, the term "semiconductor device or die" can refer to a finished device or to an assembly or other structure at various stages of processing before becoming a finished device. Depending upon the context in which it is used, the term "substrate" can refer to a wafer-level substrate or to a singulated, die-level substrate. Also, a substrate may include a semiconductor wafer, a package support substrate, an interposer, a semiconductor device or die, or the like. A person having ordinary skill in the relevant art will recognize that suitable steps of the methods described herein can be performed at the wafer level or at the die level.

Further, unless the context indicates otherwise, structures disclosed herein can be formed using conventional semiconductor-manufacturing techniques. Materials can be deposited, for example, using chemical vapor deposition (CVD), physical vapor deposition (PVD), atomic layer deposition (ALD), spin coating, plating, and/or other suitable techniques. Similarly, materials can be removed, for example, using plasma etching, wet etching, chemical-mechanical planarization (CMP), or other suitable techniques. Some of the techniques may be combined with photolithography processes. A person skilled in the relevant art will also understand that the technology may have additional embodiments, and that the technology may be practiced without several of the details of the embodiments described herein with reference to FIGS. 1A-1L, 2, and 3.

As used herein, the terms "front," "back," "vertical," "lateral," "down," "up," "upper," and "lower" can refer to relative directions or positions of features in the semiconductor device assemblies in view of the orientation shown in the Figures. For example, "upper" or "uppermost" can refer to a feature positioned closer to the top of a page than another feature. These terms, however, should be construed broadly to include semiconductor devices having other orientations. A person skilled in the relevant art will also understand that the technology may have additional embodiments, and that the technology may be practiced without several of the details of the embodiments described herein with reference to FIGS. 1A-1L, 2, and 3.

FIG. 1A illustrates a cross-sectional diagram of a substrate 105 that includes semiconductor dies 115 (e.g., semiconductor dies 115a through 115c) fabricated on its front side 106. Each semiconductor die 115 may include an integrated circuit formed on its front side. Further, the semiconductor die 115 may include one or more vias (depicted in FIGS. 1G, 1H, 1I, and 1L) coupled with the integrated circuit, and extending from the front side to a back side of the semiconductor die 115. The one or more vias (which may also be referred to as through-silicon vias (TSVs)) are configured to provide one or more electrical connections for the integrated circuit on the back side—e.g., to facilitate stacking of multiple semiconductor die 115 on top of each other. The integrated circuit and the vias of the semiconductor die 115 are omitted when multiple semiconductor dies 115 are depicted in FIGS. 1A-1L in a relatively low magnification for clear illustration of certain aspects of the principles of the present technology.

FIG. 1A also depicts a set of trenches 120 (e.g., trenches 120a through 120c) formed on the front side 106, as well as a photo resist layer 110 used to protect the semiconductor dies 115. As such, individual trenches 120 may correspond to scribe lines (or dicing lanes) of the substrate 105. In some embodiments, the photo resist layer 110 can include a hard mask layer (e.g., a hard mask with carbon). In some embodiments, forming the trenches 120 may be accomplished by performing an etch process (e.g., plasma-based dry etch process, wet etch process) known to a person skilled in the art of semiconductor fabrication technology. Although the trenches 120 are depicted to include vertical sidewalls, in some embodiments, the sidewalls of the trenches 120 may be sloped. For example, openings of the trenches 120 may be greater at the surface of the substrate 105 than those at the bottom of the trenches 120—e.g., sidewalls with a positive slope. The positive slope of the sidewalls may facilitate formation of a dielectric layer (e.g., the first dielectric layer 125) on the sidewalls to be more uniform, in some cases.

Dimensions of the trenches 120 include a width (denoted as "W" in FIG. 1A) and a depth D (denoted as "D" in FIG. 1A). The width of the trenches 120 may be less than typical widths of a dicing lane (a scribe line), which may be approximately 60 to 80 µm wide (e.g., within 10% of 60 µm, within 10% of 80 µm). In some embodiments, the width of trenches 120 may be approximately 40 µm (e.g., within 10% of 40 µm), 30 µm (e.g., within 10% of 30 µm), or even less. Further, the depth of trenches 120 can be determined based on a final thickness of the semiconductor dies 115 (denoted as "T" in FIG. 1G). Namely, the depth of trenches 120 may be devised to be greater than the final thickness of the semiconductor dies 115 such that individual semiconductor dies 115 can be singulated without a dicing process. For example, when the final thickness of the semiconductor dies 115 is approximately 50 µm (e.g., within 10% of 50 µm), the depth of trenches 120 may be approximately 55 to 60 µm (e.g., within 10% of 55 µm, within 10% of 60 µm). Additionally, or alternatively, the width and depth of the trenches 120 may be based on the aspect ratio determined by the width and depth of the trenches 120, considering the process capability associated with downstream process steps, such as process steps forming a dielectric layer (e.g., a chemical vapor deposition (CVD) process, a physical vapor deposition (PVD) process) on the sidewalls of the trenches 120 and/or filling the trenches 120 with an adhesive material, among others.

Figure 1B:
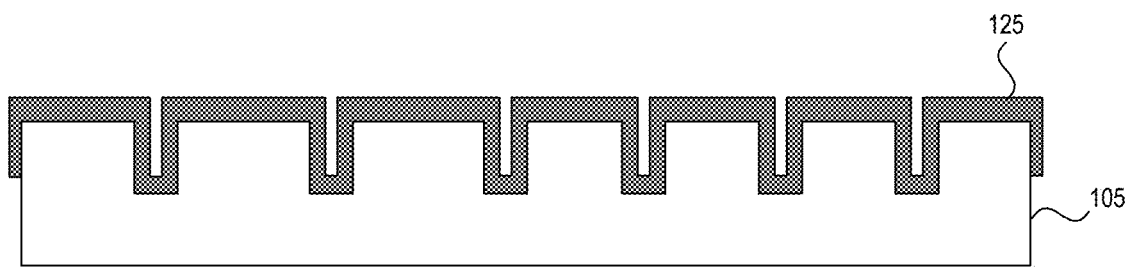

FIG. 1B illustrates a cross-sectional diagram of the substrate 105, after the photo resist layer 110 has been removed, and subsequently, a first dielectric layer 125 has been formed on the front side 106 of the substrate 105. The first dielectric layer 125 can be formed by performing one or more process steps, including a CVD process, for example. The first dielectric layer 125 may include various dielectric materials, such as an oxide, a nitride, an oxynitride, or a combination thereof. In some embodiments, an oxide layer may be formed on the silicon surface, followed by a nitride layer deposited on the oxide layer formed on the silicon surface. Such a composite layer may reduce formation of defects (e.g., crystalline defects in the substrate 105) when compared to a single layer of nitride directly formed on the silicon surface.

Figure 1C:
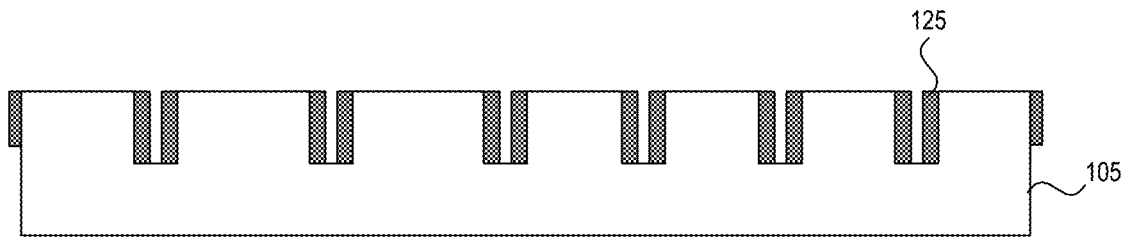

FIG. 1C illustrates a cross-sectional diagram of the substrate 105, after the first dielectric layer 125 has been removed from the front side 106 of the substrate 105, and from the bottom of the individual trenches 120. As a result, the first dielectric layer 125 remains on the sidewalls of the trenches 120. In some embodiments, an etch process (e.g., plasma-based dry etch process) may be performed to remove the first dielectric layer 125 from relatively flat regions (e.g., the front side 106, the bottom of the trenches 120) with respect to incoming flux of etchants, while retaining the first dielectric layer 125 on the sidewalls.

Figure 1D:
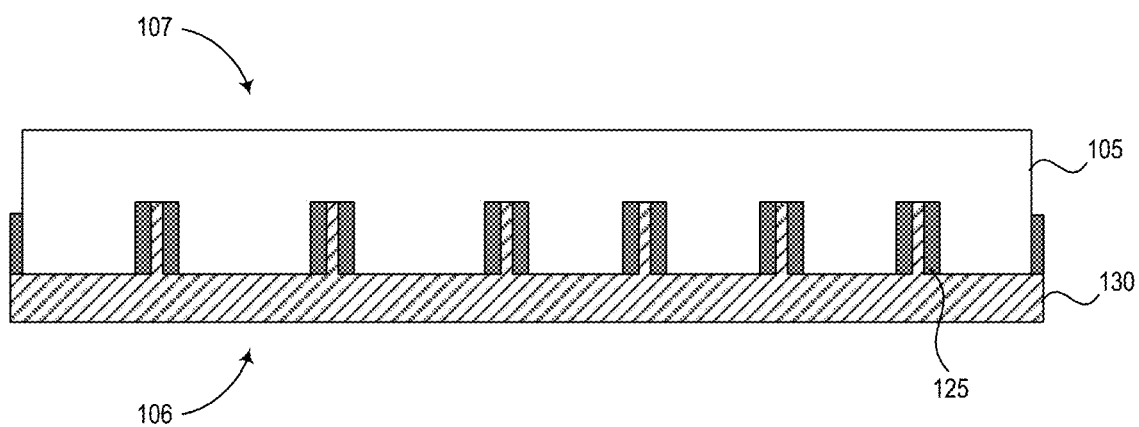

FIG. 1D illustrates a cross-sectional diagram of the substrate 105, after the trenches 120 (with the first dielectric layer 125 formed on their sidewalls) has been filled with an adhesive material 130—e.g., Nissan Chemical thermoset adhesive. The adhesive material 130 (which may be referred to as carrier adhesive) also covers (e.g., coats) the front side 106 of the substrate 105. The sidewalls of the trenches 120 are protected by the first dielectric layer 125 to prevent the adhesive material 130 directly contacting the sidewalls. In some embodiments, the adhesive material 130 may exhibit a fluid-like material property such that the trenches 120 with a high aspect ratio (e.g., a relatively narrow opening with a relatively deep trench bottom) can be filled. Further, the substrate 105 in FIG. 1D has been flipped to depict the back side 107 above the front side 106.

Figure 1E:
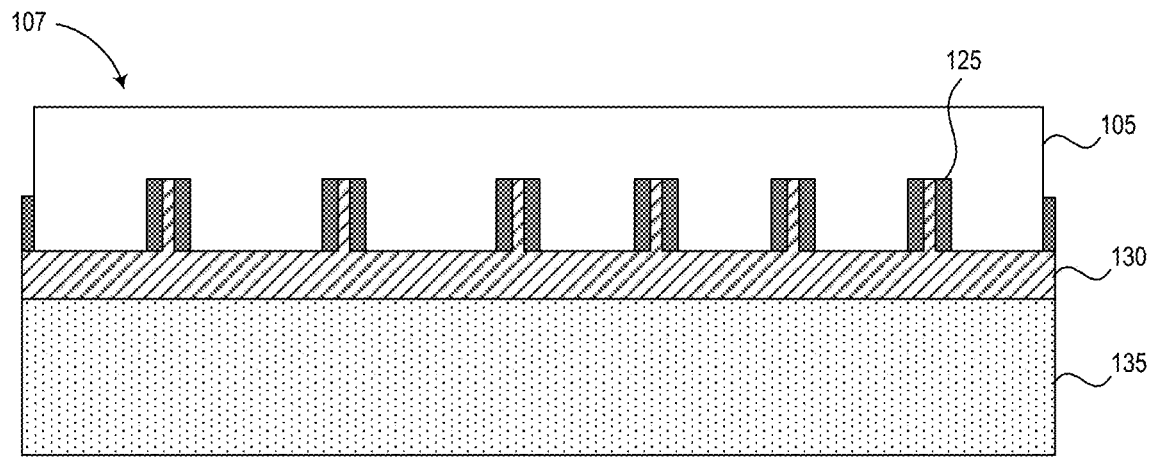

FIG. 1E illustrates a cross-sectional diagram of the substrate 105, after a carrier substrate 135 (or a support substrate) has been bonded using the adhesive material 130 on the front side 106. The carrier substrate 135 may mechanically support the substrate 105 (and the semiconductor dies 115) during subsequent process steps to be performed on the back side 107—e.g., process steps described with reference to FIGS. 1F through 1J. Further, the adhesive material 130 can be densified (e.g., set, cured) such that the adhesive material 130 becomes suitable for the subsequent processing steps. In some embodiments, a thermal process may be applied to the adhesive material 130 (e.g., thermally setting the adhesive material 130). Additionally, or alternatively, a chemical process may be applied to the adhesive material 130 (e.g., chemically setting the adhesive material 130).

Figure 1F:
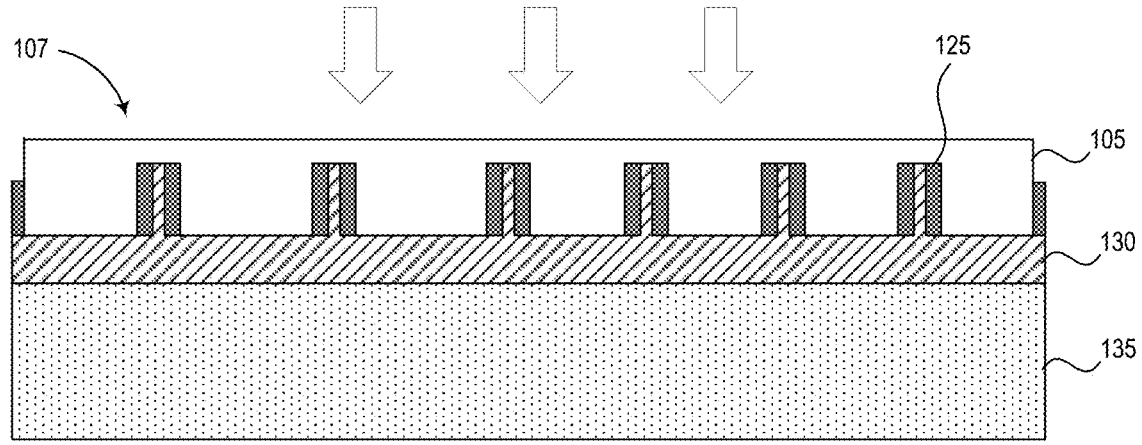

FIG. 1F illustrates a cross-sectional diagram of the substrate 105, after a first portion of the substrate 105 has been removed from the back side 107 of the substrate 105 (as indicated with arrows). In some embodiments, a backgrind and/or a chemical mechanical polishing (CMP) process (e.g., a first process) may be performed to remove the bulk of the substrate 105—e.g., thinning the substrate 105 from approximately 700 μm (e.g., within 10% of 700 μm) to approximately 100 μm (e.g., within 10% of 100 μm) or less. In other embodiments, a different process (e.g., an etch process) may be performed to remove the bulk of the substrate 105, which a person skilled in the art of semiconductor fabrication may be familiar with.

Figure 1G:
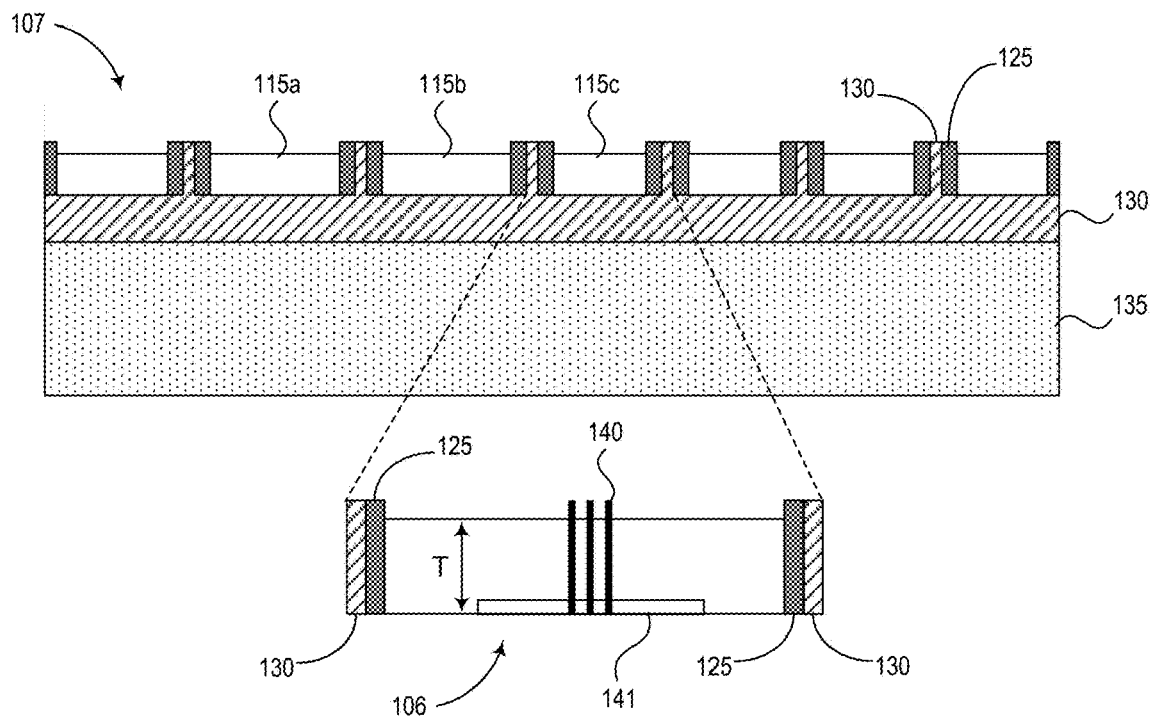

FIG. 1G illustrates a cross-sectional diagram of the substrate 105, after a second portion of the substrate 105 has been removed from the back side 107 of the substrate 105. In some embodiments, an etch process (e.g., a second process) may be performed to the back side 107 after the bulk of the substrate 105 has been removed (e.g., using the CMP process described with reference to FIG. 1F). The etch process may be configured to expose the adhesive material 130 in the trenches 120 from the back side 107 as a result of removing the second portion of the substrate 105. Further, the etch process may be devised to expose one or more through-silicon vias (TSVs) 140 of the semiconductor dies 115 from the back side 107. The TSVs are coupled with an integrated circuit 141 formed on the front side 106 of the substrate 105, and configured to provide one or more electrical connections for the integrated circuit 141 on the back side 107. In some embodiments, the back side 107 of the substrate 105 may be recessed with respect to the exposed adhesive material 130 after removing the second portion of the substrate 105. As such, the second process (e.g., the etch process) may be configured to remove the semiconductor substrate 105 at a first removal rate and the adhesive material 130 (and/or the first dielectric layer 125) at a second removal rate that is less than the first removal rate.

It should be appreciated that, after completing the second process to expose the adhesive material 130 in the trenches 120 from the back side 107 (e.g., when the etch front proceeds past the bottom of trenches 120 from the back side 107), the semiconductor dies 115 are separated from the substrate 105 because the depth of the trenches 120 is determined to be greater than the final thickness of the semiconductor dies 115 (e.g., the thickness of the semiconductor dies 115 at the completion of the etch process). In other words, individual semiconductor dies 115 are separated from the substrate 105 because the portion of the substrate 105 common to all semiconductor dies 115 no longer exist as a result of completing the second process (e.g., the etch process). Thereafter, individual semiconductor dies 115 are held to each other and to the carrier substrate 135 by the adhesive material 130. In this manner, a combination of forming trenches 120 on the front side 106 of the substrate 105 and thinning the substrate 105 from the back side 107 past the bottom of the trenches 120 accomplishes separating the semiconductor dies 115 from the substrate 105, thereby eliminating dicing steps that physically sever the semiconductor dies 115 from the substrate 105.

Still referring to FIG. 1G, as the substrate 105 common to the semiconductor dies 115 no longer exists and the semiconductor dies 115 are coupled with each other by the adhesive material 130, a warpage of the substrate 105 may be avoided during the subsequent process steps to be performed on the back side 107 of the semiconductor dies 115. In other words, pressure (or force) that may be exerted on the semiconductor dies 115 through the wafer back side processing steps may be at least partially absorbed by the adhesive material 130 in lieu of subjecting the substrate 105 to the pressure (or force) that may generate defects (e.g., slippage, crystalline dislocations) in the substrate 105—e.g., during de-bonding step.

As described herein, various process steps associated with forming trenches 120 filled with the adhesive material 130 (and the first dielectric layer 125) and thinning the substrate 105 from the back side 107 of the substrate 105 include conventional semiconductor process steps that may be performed in semiconductor fabrication environments (e.g., a clean room environment). The clean room process steps are inherently cleaner than a conventional dicing process involving mechanical dicing of the substrate 105. Thus, the semiconductor dies 115 separated from the substrate 105 in accordance with the present technology may benefit from the clean room process steps, such as reduced particles, debris, contaminants, damages, cracks, or the like, to improve yield and reliability of the semiconductor dies 115. Moreover, the final thickness of the semiconductor dies 115 may be thinner than that of the semiconductor dies 115 separated by the conventional dicing process—e.g., the semiconductor dies 115 may not have to maintain a certain thickness to sustain various forces during the dicing process. Thinner semiconductor dies 115 may reduce package heights and/or facilitate utilizing an advanced packaging technique (e.g., combination bonding) for the semiconductor dies 115.

Further, when compared with a dicing technique, the clean room process steps may be more compatible with integrating new materials (e.g., low-k dielectric material, extreme low-k dielectric material) that may be essential for advanced semiconductor devices. Additionally, the present technology may reduce a production cost of the semiconductor dies 115 because of the nature of wafer level processes that concurrently separates all the semiconductor dies 115 from the substrate 105, instead of having a saw cutting a row (or a column) of semiconductor dies 115, one row (or column) at a time. Other benefits of the present technology may include a flexible placement of the semiconductor dies 115 on the substrate 105 (which may be referred to as a wafer map of semiconductor dies) to increase a total quantity of semiconductor dies as the trenches 120 are not required to form straight lines (as in dicing lanes). For example, one or more rows (or columns) of semiconductor dies 115 may be shifted with respect to neighboring rows (or columns) of semiconductor dies 115 such that a quantity of partial dies around the perimeter of the wafer may be reduced. Moreover, the present technology may facilitate variations in shapes and sizes of the semiconductor dies 115 within a semiconductor wafer. For example, individual semiconductor dies 115 may be in a hexagonal shape (or different shapes other than conventional rectangular shape)—e.g., the hexagonal shape may increase a total quantity of memory dies that can be placed in a semiconductor wafer or provide an efficient layout of various components within the semiconductor die.

Figure 1H:
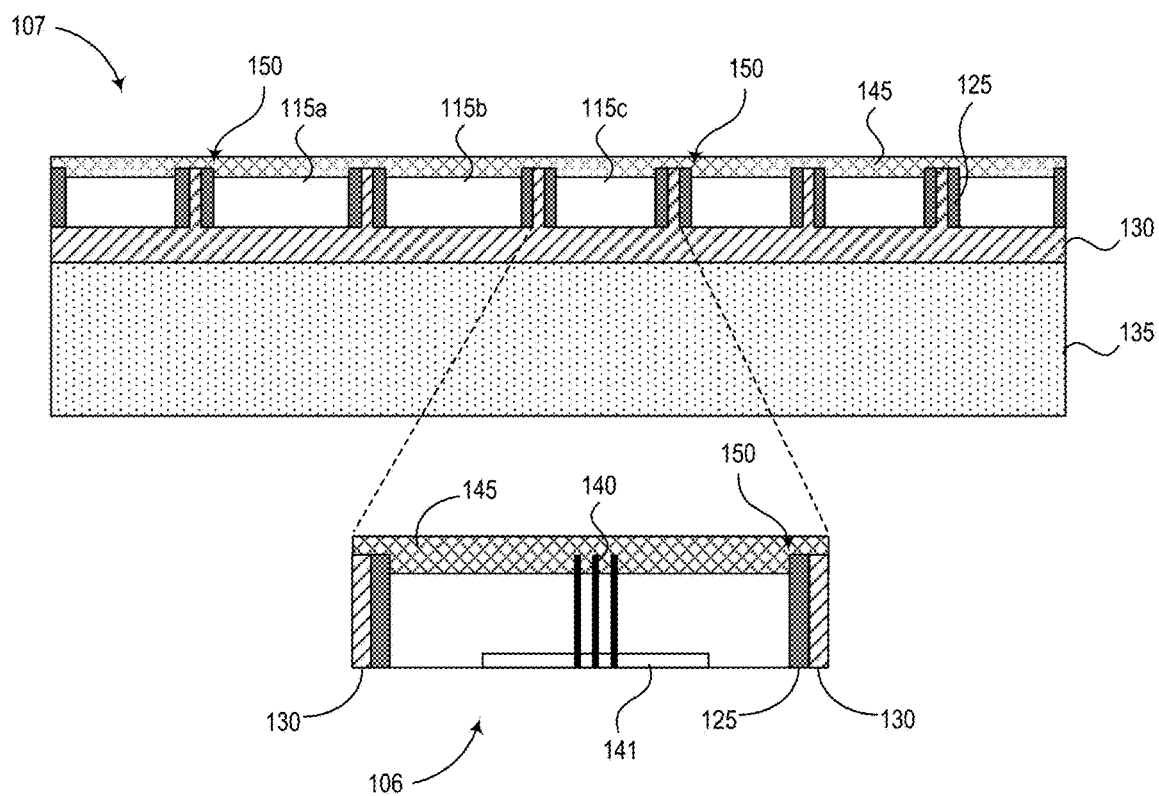

FIG. 1H illustrates a cross-sectional diagram of the semiconductor dies 115 attached to the carrier substrate 135, after a second dielectric layer 145 has been formed on the back side 107. The second dielectric layer 145 can be formed by performing one or more process steps, such as deposition processes (e.g., CVD and/or PVD processes) described with reference to FIG. 1B. The second dielectric layer 145 may include various dielectric materials, such as an oxide, a nitride, an oxynitride, or a combination thereof. In some example embodiments, the second dielectric layer 145 may include a composite layer having a nitride and an oxide formed at a relatively low temperature (which may be referred to as low temperature nitride and oxide (LTNO)). In other example embodiments, the second dielectric layer 145 may include a silicon nitride (SiN) layer and/or a layer of tetraethyl orthosilicate (TEOS). The second dielectric layer 145 may protect the back side 107 of individual semiconductor dies 115 from contaminants (e.g., copper) and/or during subsequent processing steps—e.g., one or more cleaning steps to remove the adhesive material 130, forming conductive components (e.g., under-bump metallization (UBM) structures for the TSVs 140). After forming the second dielectric layer 145, the TSVs 140 may be buried within the second dielectric layer 145. Further, an interface 150 may form between the second dielectric layer 145 and the first dielectric layer 125 (and/or the adhesive material 130).

Figure 1I:
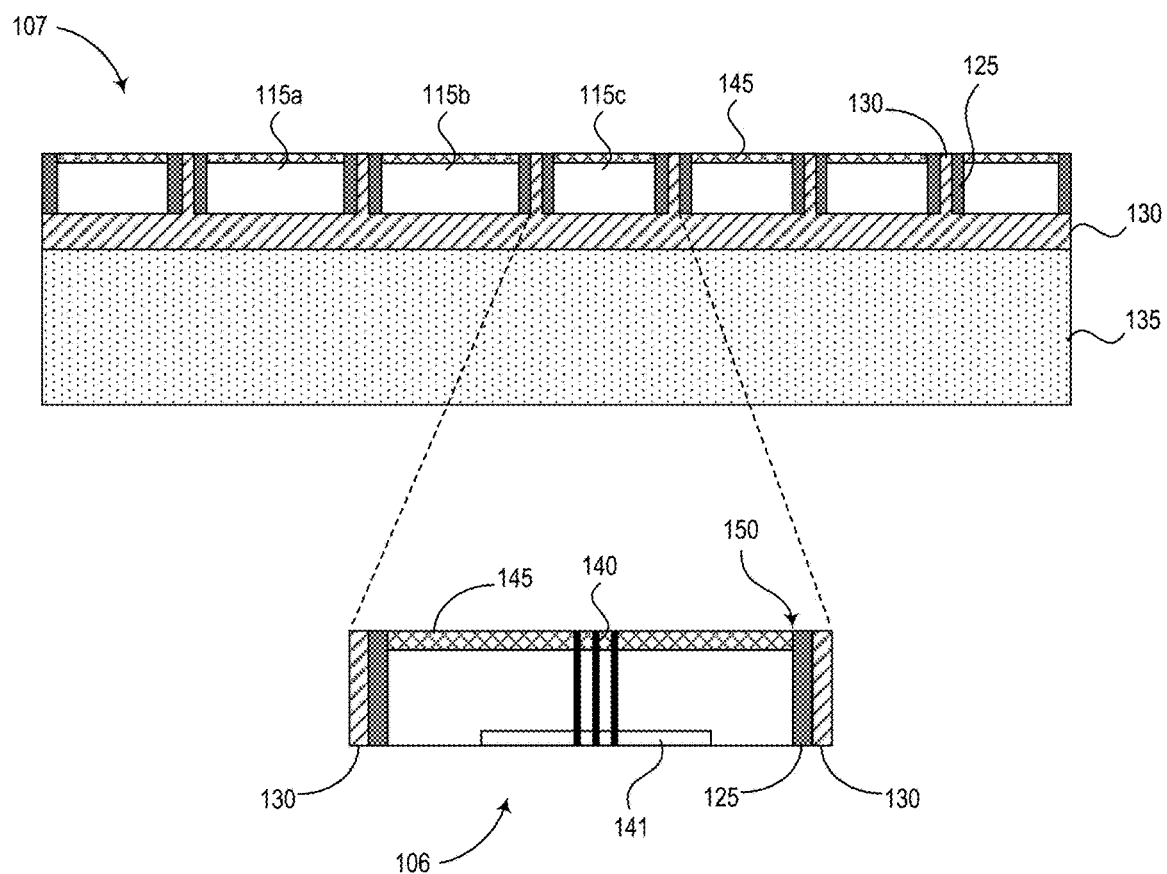

FIG. 1I illustrates a cross-sectional diagram of the semiconductor dies 115 attached to the carrier substrate 135, after a portion of the second dielectric layer 145 has been removed to expose the TSVs 140 of the semiconductor dies 115 from the back side 107. In some embodiments, a CMP process may be performed to remove the portion of the second dielectric layer 145 to expose the TSVs 140 of the semiconductor dies 115. In other embodiments, an etch process may be performed to remove the portion of the second dielectric layer 145 to expose the TSVs 140 of the semiconductor dies 115. The interface 150 between the first dielectric layer 125 and the second dielectric layer 145 may remain after the CMP process step (or the etch process step).

In some embodiments, after exposing the TSVs 140 on the surface of the second dielectric layer 145, one or more process steps may be performed on the back side 107 to form conductive components—e.g., UBM structures corresponding to the TSVs 140 to facilitate stacking of the semiconductor dies 115. Such process steps may include additional deposition process steps (e.g., forming one or more metallic/conductive layers), photolithography process steps (e.g., defining UBM structures corresponding to the TSVs 140), etch process steps (e.g., removing excessive metallic/conductive materials where unnecessary), clean process steps (e.g., removing photo resists, removing various by-products generated during etch process steps), among others. The adhesive material 130, once cured (e.g., thermally set as described with reference to FIG. 1E), may exhibit material properties (e.g., modulus of rigidity) sufficient to sustain its structural and/or compositional integrity during the process steps—e.g., remaining within the trenches 120. The adhesive material 130, however, may be removed using a specific solvent that selectively dissolves the adhesive material 130.

Figure 1J:
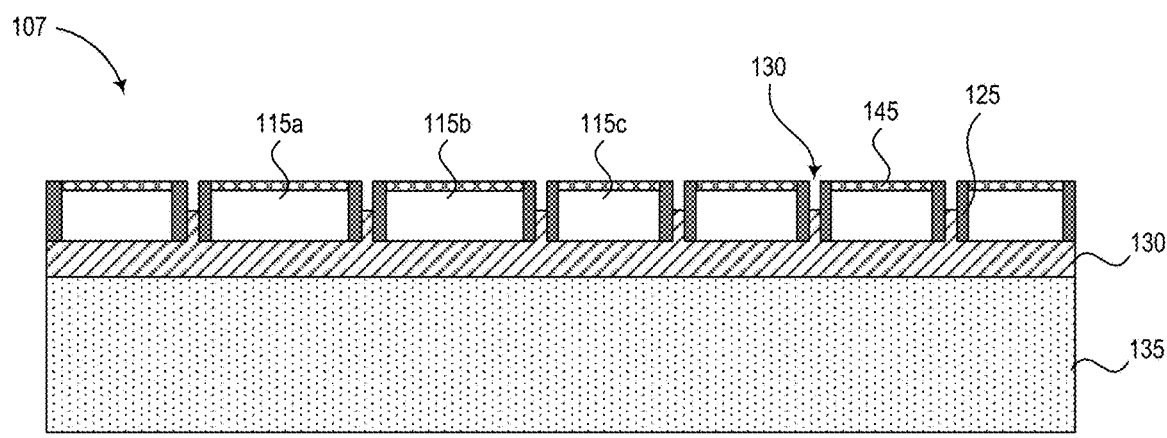

FIG. 1J illustrates a cross-sectional diagram of the semiconductor dies 115 attached to the carrier substrate 135, after the adhesive material 130 within the trenches 120 has been partially removed from the back side 107 using a cleaning process (e.g., using the specific solvent that dissolves the adhesive material 130). Removing the portion of the adhesive material 130 at this stage facilitates completely removing the adhesive material 130 from the trenches 120 as described with reference to FIG. 1L. In some embodiments, this cleaning step may be omitted.

Figure 1K:
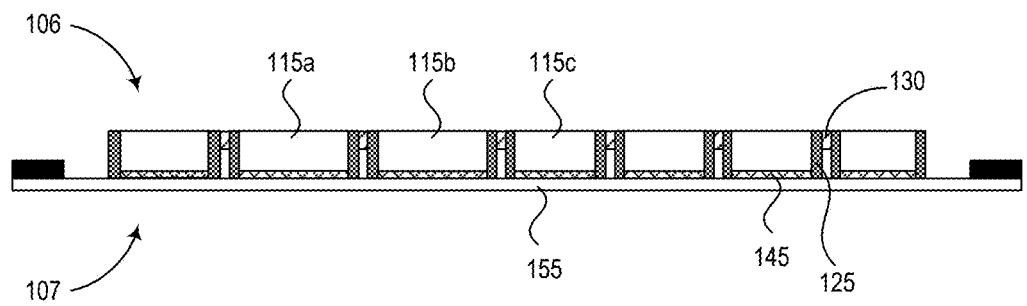

FIG. 1K illustrates a cross-sectional diagram of the semiconductor dies 115 attached to a sheet of film frame 155, after the carrier substrate 135 has been detached (de-bonded) from the semiconductor dies 115 (e.g., by removing the adhesive material 130 between the carrier substrate 135 and the semiconductor dies 115). Further, the semiconductor dies 115 in FIG. 1K has been flipped to depict the front side 106 above the back side 107. FIG. 1K also depicts remaining adhesive material 130 within the trenches 120.

Figure 1L:
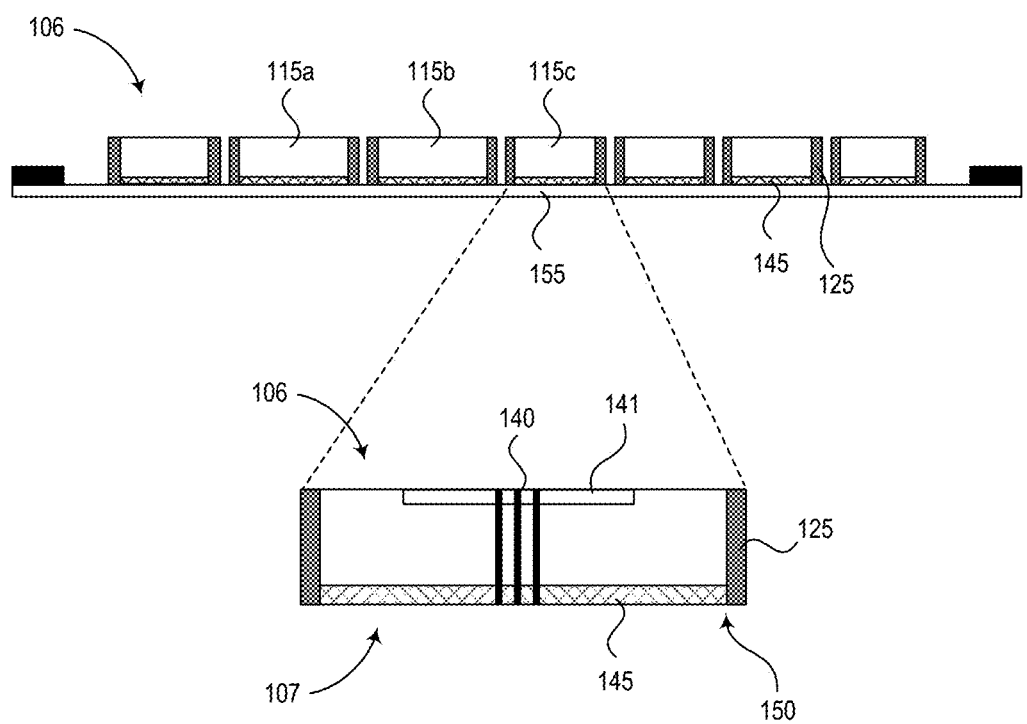

FIG. 1L illustrates a cross-sectional diagram of the semiconductor dies 115 attached to the sheet of film frame 155, after the adhesive material 130 in the trenches 120 has been removed. Subsequently, individual dies 115 may be tested for their functionality and picked up from the sheet of film frame 155 for further processing, e.g., stacking multiple semiconductor dies 115 to form a semiconductor die assembly.

Each semiconductor die 115 may include an integrated circuit (e.g., the integrated circuit 141) formed on a front side (e.g., the front side 106) of a semiconductor substrate, a first dielectric layer (e.g., the first dielectric layer 125) on a sidewall of the semiconductor substrate, and a second dielectric layer (e.g., the second dielectric layer 145) on a back side (e.g., the back side 107) of the semiconductor substrate opposite to the front side, where the second dielectric layer may be discontinuous from the first dielectric layer (e.g., due to the interface 150 between the first dielectric layer 125 and the second dielectric layer 145). In some embodiments, the first dielectric layer includes at least two dielectric materials—e.g., an oxide layer in contact with the sidewall of the semiconductor substrate and a nitride layer in contact with the oxide layer. In some embodiments, the first dielectric layer includes a first dielectric material (e.g., oxide), and the second dielectric layer includes a second dielectric material (e.g., nitride) different from the first dielectric material. In some embodiments, the first and second dielectric materials include an oxide, a nitride, an oxynitride, or a combination thereof. In some embodiments, the semiconductor die 115 may include one or more vias (e.g., TSVs 140) extending from the front side of the semiconductor substrate past the second dielectric material on the back side, where the one or more vias are coupled with the integrated circuit and configured to provide one or more electrical connections for the integrated circuit on a surface of the second dielectric material (e.g., the second dielectric layer 145).

Figure 2:
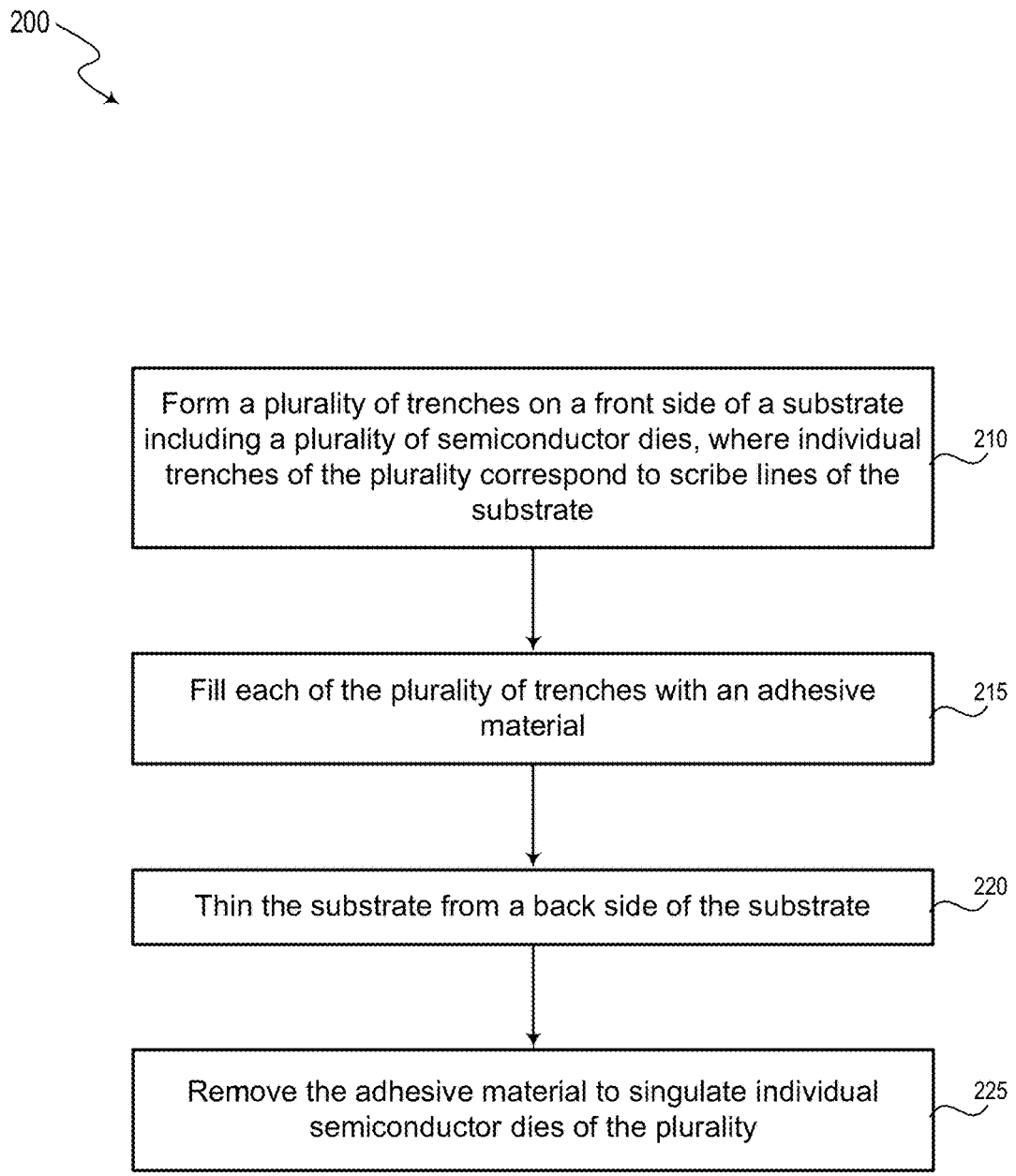
FIGS. 2 and 3 are flowcharts illustrating methods of protecting semiconductor die edge and separating semiconductor dies in accordance with embodiments of the present technology.

FIG. 2 is a flowchart 200 illustrating a method of protecting edges of semiconductor dies in accordance with an embodiment of the present technology. The flowchart 200 may include aspects of methods as described with reference to FIGS. 1A through 1L.

The method includes forming a plurality of trenches on a front side of a substrate including a plurality of semiconductor dies, where individual trenches of the plurality correspond to scribe lines of the substrate (box 210). The method further includes filling each of the plurality of trenches with an adhesive material (box 215). The method further includes thinning the substrate from a back side of the substrate (box 220). The method further includes removing the adhesive material to singulate individual semiconductor dies of the plurality (box 225).

In some embodiments, forming the plurality of trenches includes performing an etch process on the front side of the substrate. In some embodiments, each trench of the plurality of trenches includes a depth greater than a thickness of the singulated individual semiconductor dies. In some embodiments, the method may further include forming a first dielectric layer on sidewalls of the plurality of trenches, prior to filling each of the plurality of trenches with the adhesive material. In some embodiments, the method may further include attaching, prior to thinning the substrate from the back side, a carrier substrate to the substrate using the adhesive material on the front side of the substrate.

In some embodiments, thinning the substrate from the back side includes exposing the adhesive material in each of the plurality of trenches from the back side of the substrate. In some embodiments, the method may further include forming, after thinning the substrate from the back side, a second dielectric layer on the back side of the substrate, and removing at least a portion of the second dielectric layer to expose the adhesive material in each of the plurality of trenches. In some embodiments, removing at least the portion of the second dielectric layer also exposes one or more through-silicon vias (TSVs) of the plurality of semiconductor dies. In some embodiments, the method may further include attaching a sheet of film frame to the second dielectric layer remaining on the back side of the substrate, prior to removing the adhesive material.

Figure 3:
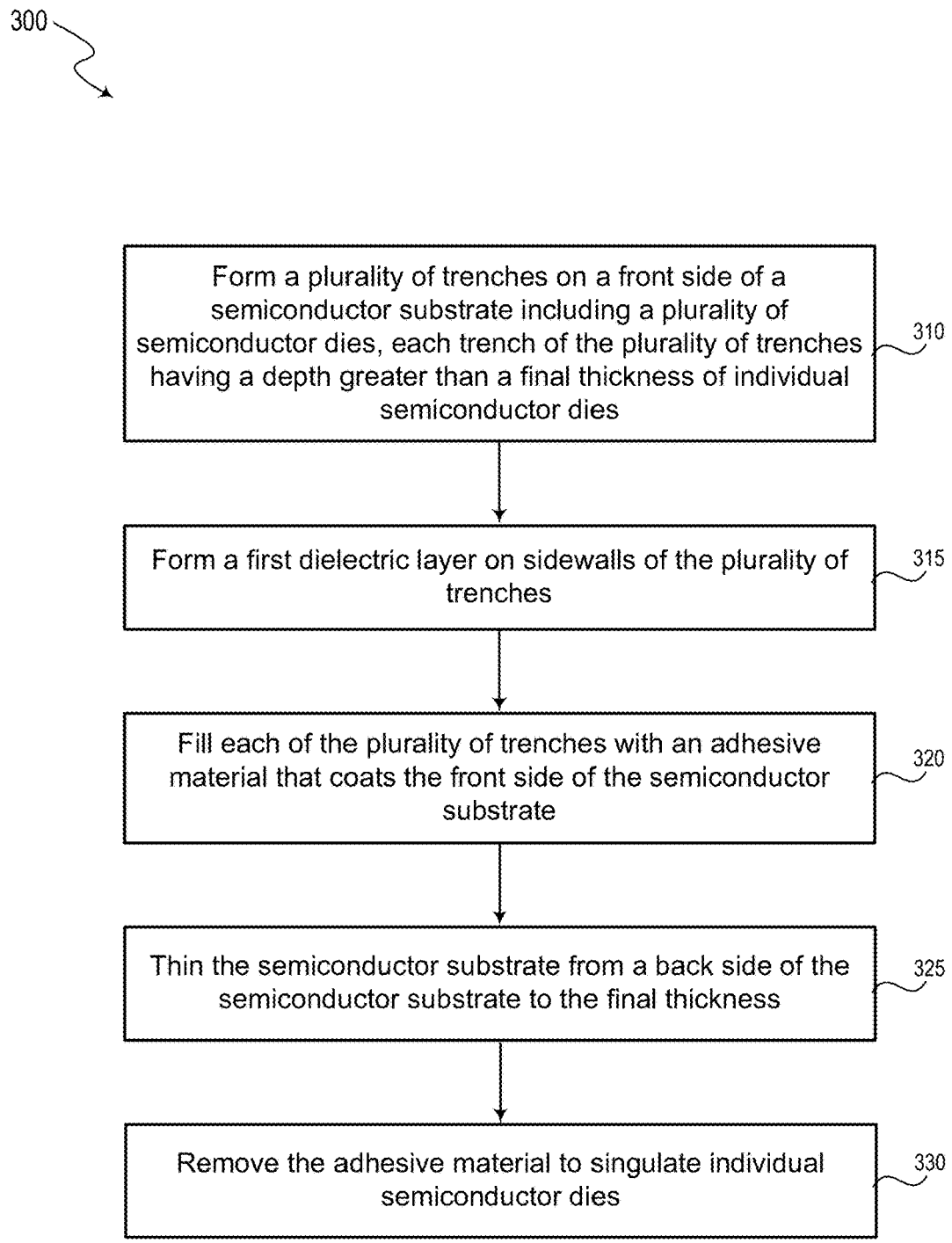

FIG. 3 is a flowchart 300 illustrating a method of protecting edges of semiconductor dies in accordance with an embodiment of the present technology. The flowchart 300 may include aspects of methods as described with reference to FIGS. 1A through 1L.

The method includes forming a plurality of trenches on a front side of a semiconductor substrate including a plurality of semiconductor dies, each trench of the plurality of trenches having a depth greater than a final thickness of individual semiconductor dies (box 310). The method further includes forming a first dielectric layer on sidewalls of the plurality of trenches (box 315). The method further includes filling each of the plurality of trenches with an adhesive material that coats the front side of the semiconductor substrate (box 320). The method further includes thinning the semiconductor substrate from a back side of the semiconductor substrate to the final thickness (box 325). The method further includes removing the adhesive material to singulate individual semiconductor dies (box 330).

In some embodiments, forming the first dielectric layer on the sidewalls further comprises forming the first dielectric layer on the front side of the semiconductor substrate including the plurality of trenches, and performing an etch process on the front side of the semiconductor substrate to remove the first dielectric layer from the front side of the semiconductor substrate and from the bottom of individual trenches of the plurality. In some embodiments, the method may further comprise attaching, prior to thinning the semiconductor substrate, a carrier substrate to the semiconductor substrate using the adhesive material on the front side of the semiconductor substrate.

In some embodiments, thinning the semiconductor substrate from the back side further comprises removing a first portion of the semiconductor substrate from the back side using a first process without exposing the adhesive material in the trenches, and removing, after removing the first portion, a second portion of the semiconductor substrate from the back side using a second process to expose the adhesive material in the trenches as a result of removing the second portion of the semiconductor substrate. In some embodiments, the second process is configured to remove the semiconductor substrate at a first removal rate and the adhesive material at a second removal rate less than the first removal rate. In some embodiments, the back side of the semiconductor substrate is recessed with respect to the exposed adhesive material after removing the second portion.

It should be noted that the methods described above describe possible implementations, and that the operations and the steps may be rearranged or otherwise modified and that other implementations are possible. Furthermore, embodiments from two or more of the methods may be combined.

From the foregoing, it will be appreciated that specific embodiments of the technology have been described herein for purposes of illustration, but that various modifications may be made without deviating from the disclosure. For example, although the foregoing example process sequence illustrates the first process (e.g., the CMP process) achieving the results depicted in FIG. 1F and the second process (e.g., the etch process) achieving the results depicted in FIG. 1G as two separate process steps utilizing two different process modules (e.g., CMP module and etch module), the present technology is not limited thereto. Namely, process steps to thin the substrate 105 to expose the adhesive material 130 (and the TSVs 140) from the back side 107 may be performed without using two different process modules.

For example, after removing the bulk of the substrate 105 using the CMP process to achieve the results depicted in FIG. 1F (e.g., based on a total CMP process time using a previously established substrate removal rate), various process parameters for the CMP process may be modified (e.g., using a different slurry, changing pressures associated with a wafer chuck and/or a stage of the CMP tool, tweaking rotation speeds/directions of the wafer chuck and/or the stage, etc.) to reduce the substrate removal rate such that the CMP process may continue to remove the substrate 105 with a fine-tuned removal rate to expose the adhesive material 130 to achieve the results depicted in FIG. 1G, thereby without switching to an etch process. Additionally, or alternatively, the CMP process may utilize an endpoint mechanism based on detecting a change in friction monitored by a motor of the CMP tool when the first dielectric layer 125 and the adhesive material 130 is exposed. Such an endpoint mechanism may indicate that the CMP process has reached to the bottom of trenches 120 from the back side 107, at least in certain areas of the substrate 105 such that the CMP process can be fine-tuned thereafter to precisely control the removal rate. In addition, certain aspects of the present technology described in the context of particular embodiments may also be combined or eliminated in other embodiments.

The devices discussed herein, including a semiconductor device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

What is claimed is:

1. A method comprising:
    forming a plurality of trenches on a front side of a substrate including a plurality of semiconductor dies, wherein individual trenches of the plurality correspond to scribe lines of the substrate;
    filling each of the plurality of trenches with an adhesive material;
    thinning the substrate from a back side of the substrate;
    forming, after thinning the substrate from the back side, a second dielectric layer on the back side of the substrate;
    removing at least a portion of the second dielectric layer to expose the adhesive material in each of the plurality of trenches; and
    dissolving, with a solvent, the adhesive material in the plurality of trenches to singulate individual semiconductor dies of the plurality of semiconductor dies.

2. The method of claim 1, wherein forming the plurality of trenches includes performing an etch process on the front side of the substrate.

3. The method of claim 1, wherein each trench of the plurality of trenches includes a depth greater than a thickness of the singulated individual semiconductor dies.

4. The method of claim 1, further comprising:
    forming a first dielectric layer on sidewalls of the plurality of trenches, prior to filling each of the plurality of trenches with the adhesive material.

5. The method of claim 1, further comprising:
    attaching, prior to thinning the substrate from the back side, a carrier substrate to the substrate using the adhesive material on the front side of the substrate.

6. The method of claim 1, wherein thinning the substrate from the back side includes exposing the adhesive material in each of the plurality of trenches from the back side of the substrate.

7. The method of claim 1, wherein removing at least the portion of the second dielectric layer also exposes one or more through-silicon vias (TSVs) of the plurality of semiconductor dies.

8. The method of claim 1, further comprising:
    attaching a sheet of film frame to the second dielectric layer remaining on the back side of the substrate, prior to dissolving the adhesive material.

9. A method comprising:
    forming a plurality of trenches on a front side of a semiconductor substrate including a plurality of semiconductor dies, each trench of the plurality of trenches having a depth greater than a final thickness of individual semiconductor dies;
    forming a first dielectric layer on sidewalls of the plurality of trenches;
    filling each of the plurality of trenches with an adhesive material that coats the front side of the semiconductor substrate;
    thinning the semiconductor substrate from a back side of the semiconductor substrate to the final thickness; and
    dissolving, with a solvent, the adhesive material in the plurality of trenches to singulate the individual semiconductor dies,
    wherein forming the first dielectric layer on the sidewalls further comprises:
        forming the first dielectric layer on the front side of the semiconductor substrate including the plurality of trenches; and
        performing an etch process on the front side of the semiconductor substrate to remove the first dielectric layer from the front side of the semiconductor substrate and from the bottom of individual trenches of the plurality of trenches.

10. The method of claim 9, further comprising:
    attaching, prior to thinning the semiconductor substrate, a carrier substrate to the semiconductor substrate using the adhesive material on the front side of the semiconductor substrate.

11. The method of claim 9, wherein thinning the semiconductor substrate from the back side further comprises:
    removing a first portion of the semiconductor substrate from the back side using a first process without exposing the adhesive material in the trenches; and
    removing, after removing the first portion, a second portion of the semiconductor substrate from the back side using a second process to expose the adhesive material in the trenches as a result of removing the second portion of the semiconductor substrate.

12. The method of claim 11, wherein the second process is configured to remove the semiconductor substrate at a first removal rate and the adhesive material at a second removal rate less than the first removal rate.

13. The method of claim 11, wherein the back side of the semiconductor substrate is recessed with respect to the exposed adhesive material after removing the second portion.

* * * * *